United States Patent

Sonoda

(10) Patent No.: US 7,274,569 B2
(45) Date of Patent: Sep. 25, 2007

(54) POWER CONVERSION DEVICE

(75) Inventor: Isao Sonoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 309 days.

(21) Appl. No.: 11/130,248

(22) Filed: May 17, 2005

(65) Prior Publication Data

US 2005/0259403 A1 Nov. 24, 2005

(30) Foreign Application Priority Data

May 24, 2004 (JP) ............................. 2004-152823

(51) Int. Cl.
*H05K 7/20* (2006.01)
(52) U.S. Cl. .................. 361/714; 361/715; 361/719; 361/720; 361/721; 174/16.3; 165/80.3
(58) Field of Classification Search ............. None
See application file for complete search history.

(56) References Cited

U.S. PATENT DOCUMENTS

| | | | | |
|---|---|---|---|---|
| 5,091,823 A | * | 2/1992 | Kanbara et al. | 361/697 |
| 5,185,691 A | * | 2/1993 | Korinsky | 361/720 |
| 6,297,549 B1 | * | 10/2001 | Hiyoshi | 257/703 |
| 6,396,692 B1 | * | 5/2002 | Farshi et al. | 361/690 |
| 6,549,409 B1 | * | 4/2003 | Saxelby et al. | 361/704 |
| 6,724,631 B2 | * | 4/2004 | Ye et al. | 361/719 |
| 6,870,738 B2 | * | 3/2005 | Goebl | 361/719 |
| 6,956,743 B2 | * | 10/2005 | Miller et al. | 361/719 |
| 7,057,896 B2 | * | 6/2006 | Matsuo et al. | 361/704 |
| 2005/0213305 A1 | * | 9/2005 | Martin et al. | 361/714 |

FOREIGN PATENT DOCUMENTS

JP 2000-14169 A 1/2000

* cited by examiner

*Primary Examiner*—Boris Chervinsky
(74) *Attorney, Agent, or Firm*—Sughrue Mion Pllc.

(57) ABSTRACT

A power conversion device is downsized by integrally constructing a power conversion module and a control circuit board. The power conversion device includes a power conversion module 11, a control circuit board 21, and a heat sink 12. A case is divided into a module case 13 and a control circuit case 23. In a power conversion module section 10, the power conversion module 11 is thermally coupled to the heat sink 12 and contained in the module case 13 with a radiator fin 12a exposed to outside, one side of the case 13 being open. In a control circuit section 20, the control circuit board 21 is contained in the control circuit case 23, one side of the case 23 being open. Opening sides of the module section 10 and the circuit section 20 are opposite each other, and between which a heat insulating partition wall 30 is inserted.

8 Claims, 2 Drawing Sheets

POWER CONVERSION DEVICE

BACKGROUND OF THE INVENTION

1. Field of the Invention

The present invention relates to a power conversion device such as ac/dc converter whose function is to convert DC of a DC power supply, e.g., battery to AC, or to convert AC to DC; or inverter whose function is to convert power-frequency AC to AC of different frequency.

2. Description of the Related Art

A power conversion device such as ac/dc converter functioning to convert DC to AC, or AC to DC, or inverter functioning to convert power-frequency AC to AC of different frequency is comprised of: a power conversion module, which performs power conversion between DC and AC, or between power-frequency AC and AC of different frequency; and a control circuit board into which a control circuit to control this power conversion module is integrated. To meet needs of higher performance and downsizing of a power conversion device, a power conversion module and a control circuit board is packaged in one case, whereby downsizing of devices is achieved.

A large current is controlled at the power conversion module, so that the sharp temperature rise occurs due to heat generation, the power conversion module coming to be at a high temperature. In addition, many parts having intolerance for high temperature are used as components forming a control circuit. Accordingly, in the device, it is necessary for the control circuit board to be constructed so as to be free from the effect of heat of the power conversion module.

Downsizing a power conversion module has been popularized with the advance of technology, and needs of downsizing a power conversion device that employs such a power conversion module is increasing. To achieve the downsizing of the power conversion device, a power conversion module and a control circuit board are constructed as an integral whole. In such a construction, thermal insulation is secured between a power conversion module and a control circuit board, and heat having been generated is radiated to outside efficiently so that the control circuit board is free from the generated heat of the power conversion module, whereby it becomes possible to achieve a downsized power conversion device.

To make a control circuit board less affected by generated heat of a power conversion module, a construction is disclosed in, for example, the Japanese Patent Publication (unexamined) No. 014169/2000.

This construction, as shown in claim 1 and FIG. 1 of the Japanese Patent Publication (unexamined) No. 014169/2000, includes an armored case that contains therein a power conversion module and a control board; a radiator fin to which the power conversion module is fixed; and a heat insulating partition wall that is located inside the armored case and between the control board and the radiator fin.

According to such construction, the heat effect of the power conversion module on the control circuit board is thermally interrupted with the heat insulating partition wall. Even if there is no large spacing between the power conversion module and the control circuit board, the temperature rise of a control circuit board is suppressed, thus enabling to achieve the downsizing of device.

SUMMARY OF THE INVENTION

In the power conversion device disclosed in the Japanese Patent Publication (unexamined) No. 014169/2000, a heat insulating partition wall is disposed inside an armored case, as well as between a power conversion module and a control circuit board. According this construction, although radiant heat is interrupted, the heat insulating partition wall is in the state of being contained in the armored case and only serves as a mere shielding plate. Furthermore, the invasion of heat from the armored case into the control circuit board is supposed, and therefore it is difficult to carry out the complete heat rejection with respect to the control circuit board. Thus, a problem exists in that there a limit in downsizing the device.

The present invention was made to solve the above-mentioned problems, and has an object of providing a power conversion device, which includes a power conversion module and a control circuit board, and in which a distance between the power conversion module and a control circuit is reduced.

A power conversion device according to the invention includes: a power conversion module; a control circuit board on which a control circuit to control the mentioned power conversion module is arranged; a heat sink serving to radiate generated heat of the power conversion module; and a case that contains therein the power conversion module and the control circuit board. The case is divided into a module case that contains the power conversion module and a control circuit case that contains the control circuit board. Further, there are provided a power conversion module section in which the power conversion module and the heat sink are thermally coupled, the power conversion module is contained in the module case in such a manner that a radiator fin of the heat sink is exposed to outside, and one side of the module case is put in an open state; and a control circuit section in which the control circuit board is contained in the control circuit case, and one side of the control circuit case is put in an open state. Furthermore, a heat insulating partition wall functioning to do heat rejection is inserted between the power conversion module section and the control circuit section to couple the two sections.

According to this invention, a power conversion device is constructed such that a power conversion module and a control circuit board are thermally interrupted. Even if a distance between both of them is made smaller, generated heat of the power conversion module section exerts no heat effect on the control circuit board, thus enabling a power conversion device to be constructed in small size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
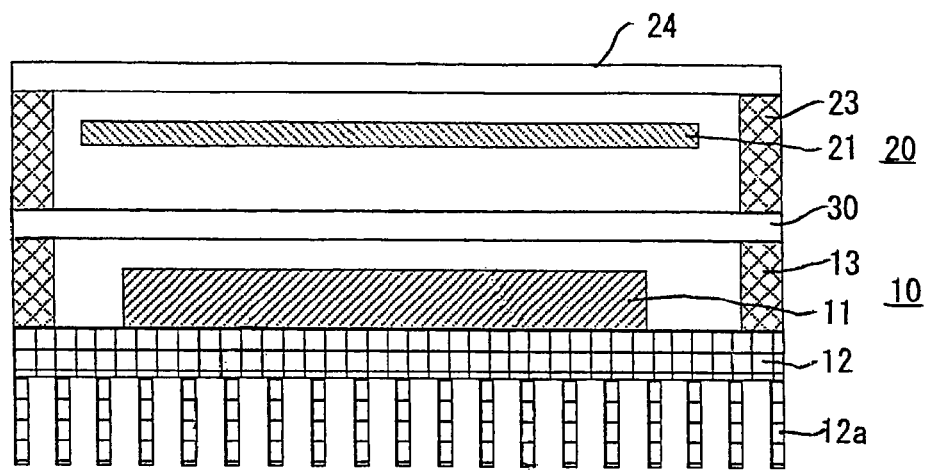
FIG. 1 is a cross sectional view of a power conversion device according to a first preferred embodiment.

FIG. 1 is across sectional view of a power conversion device according to a first preferred embodiment. In this first embodiment, a storage case is constructed in a manner of being divided into a module case 13 that contains therein a power conversion module 11, and a control circuit case 23 that contains therein a control circuit board 21. In a power conversion module section 10 in which the power conversion module 11 is contained, the power conversion module 11 is coupled to a heat sink 12 provided with a radiator fin 12a, and the power conversion module 11 is contained in the module case 13 so that the radiator fin 12a is located outside, and the power conversion module 11 is located inside the module case 13. Further, one side of the module case 13 is put in an open state. On the other hand, in a control circuit section 20 to control the power conversion module 11, a control circuit board 21 onto which parts forming a control circuit are mounted is contained in the control circuit case 23, and an end face thereof is sealed with a cover 24 and the other end is put in an open state. Then, the power conversion device according this first embodiment is constructed such that respective opening sides of the power conversion module section 10 and the control circuit section 20 are opposite to each other, and a heat insulating partition wall 30 that is made of a heat insulating material is inserted therebetween to couple the two sections.

In addition, a distance between the power conversion module 11 of the power conversion module section 10 and the heat insulating partition wall 30 is designed to be not more than a predetermined distance (approximately 10 mm), and an air heat insulating barrier is formed between the power conversion module 11 and the heat insulating partition wall 30.

Due to such a construction in which a power conversion device is divided into the power conversion module section 10 and the control circuit section 20 and the heat insulating partition wall 30 is inserted therebetween to couple the two sections, most heat having been generated at the power conversion module 11 is radiated from the radiator fin 12a of the heat sink 12. Further since the heat insulating partition wall 30 having heat-insulating properties is located between the power conversion module section 10 and the control circuit section 20, there is no heat conduction between the cases. Since an internal part of the module case 13 and that of the control circuit case 23 are independent spaces, there is no heat transfer due to convection therebetween. Furthermore, the control circuit section 20 is not exposed to radiant heat that is radiated from the power conversion module 11, and the power conversion module section 10 and the control circuit section 20 are kept in a state in which almost the complete heat rejection is performed by the heat insulating partition wall 30 therebetween.

Accordingly, it becomes unnecessary to keep such a distance as is determined by taking the heat effect into consideration between the power conversion module 11 and the control circuit board 21, and a distance therebetween can be made smaller, thus enabling to construct a small-sized power conversion device.

Further, by causing a distance between the power conversion module 11 of the power conversion module section 10 and the heat insulating partition wall 30 to be not more than a predetermined distance (approximately 10 mm), the convection of air between the power conversion module 11 and he heat insulating partition wall 30 is suppressed, and an air heat insulating barrier is formed between the power conversion module 11 and the heat insulating partition wall 30, thus enabling to suppress heat transfer.

Furthermore, by pasting an aluminum plate to a surface on the power conversion module side of the heat insulating partition wall 30 or treating this surface to be a glossy surface having a high reflectance of radiant heat by, e.g., aluminum evaporation, less radiant heat from the power conversion module 11 and an inner face of the heat sink 12 will be absorbed, resulting in better heat insulating effect.

Embodiment 2

Figure 2:
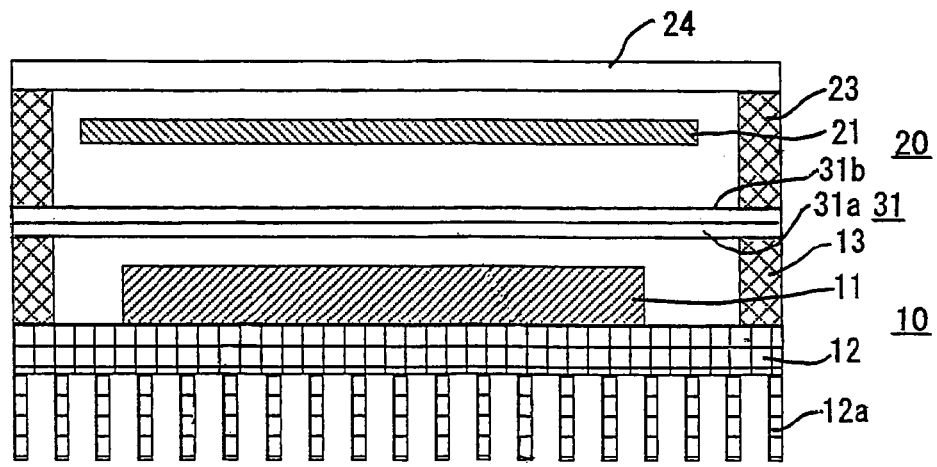
FIG. 2 is a cross sectional view of a power conversion device according to a second embodiment.

Construction according to a second embodiment is shown in FIG. 2. In this second embodiment, a heat insulating partition wall between a power conversion module section 10 and a control circuit section 20 is a heat insulating partition wall 31 of a heat conducting plate 31a and a heat insulating plate 31b being laminated. The power conversion module section 10 and the control circuit section 20 are of the same construction as those of FIG. 1 according to the foregoing first embodiment, and further detailed description thereof is omitted.

The following materials are suitable for the heat conducting plate 31a and the heat insulating plate 31b. The heat conducting plate 31a of the heat insulating partition wall 31 may be made of, for example, an aluminum plate of high thermal conductivity, and the heat insulating plate 31b of the heat insulating partition wall 31 may be made of, for example, a silicon resin laminate having heat resistance.

The heat insulating partition wall 31 is inserted between the power conversion module section 10 and the control circuit section 20 so that the heat conducting plate 31a is on the side of the power conversion module.

Owing to this construction, the heat conducting plate 31a is exposed to radiant heat from the power conversion module 11, conducts heat to the side of the module case 13, and the heat is radiated from the case portion, thus resulting in less heat effect on the control circuit board 21.

In addition, by treating a surface of the heat conducting plate 31a opposite to the power conversion module 11 to be a glossy surface of high reflectance of radiant heat, less radiant heat from the power conversion module 11 and an inner face of the heat sink 12 will be absorbed, resulting in improvement in heat insulating effect between the power conversion module section 10 and the control circuit section 20.

Embodiment 3

Figure 3:
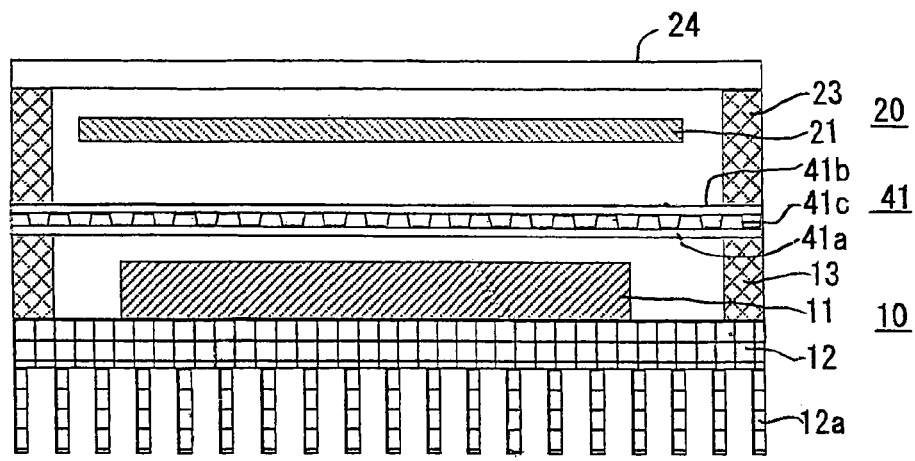
FIG. 3 is a cross sectional view of a power conversion device according to a third embodiment.

Construction according to a third embodiment is shown in FIG. 3. This third embodiment has such a construction that a heat insulating partition wall 41 formed as follows is inserted between the power conversion module section 10 and the control circuit section 20. The heat insulating partition wall 41 is formed such that the side of the power conversion module section 10 is comprised of a heat conducting plate 41a made of, for example, an aluminum plate of high thermal conductivity; the side of the control circuit section 20 is comprised of a heat insulating plate 41b; and a spacer 41c formed by molding a thin aluminum plate into a corrugated shape is inserted between the heat conducting plate 41a and the heat insulating plate 41b to form an air space. The power conversion module section 10 and the control circuit section 20 have the same construction as those of FIG. 1 according to the foregoing first embodiment.

Owing to this construction, the heat conducting plate 41a is exposed to radiant heat from the power conversion module 11. When temperature rises, the heat will be radiated by the convection of air in an air space that is formed at the portion of the spacer 41c, thus enabling to almost completely eliminate the heat effect on the side of the control circuit section 20.

When the air space portion is located so as to be in a vertical direction, the convection in the air space is improved, resulting in a higher cooling effect. Furthermore, the heat effect on the portion of the control circuit section 20 will become still smaller.

Also in this construction, by treating a surface of the heat conducting plate 41a opposite to the power conversion module 11 to be a glossy surface of high reflectance of radiant heat, less radiant heat from the power conversion module 11 and an inner face of the heat sink 12 will be absorbed, resulting in improvement in heat insulating effect between the power conversion module section 10 and the control circuit section 20.

Embodiment 4

Figure 4:
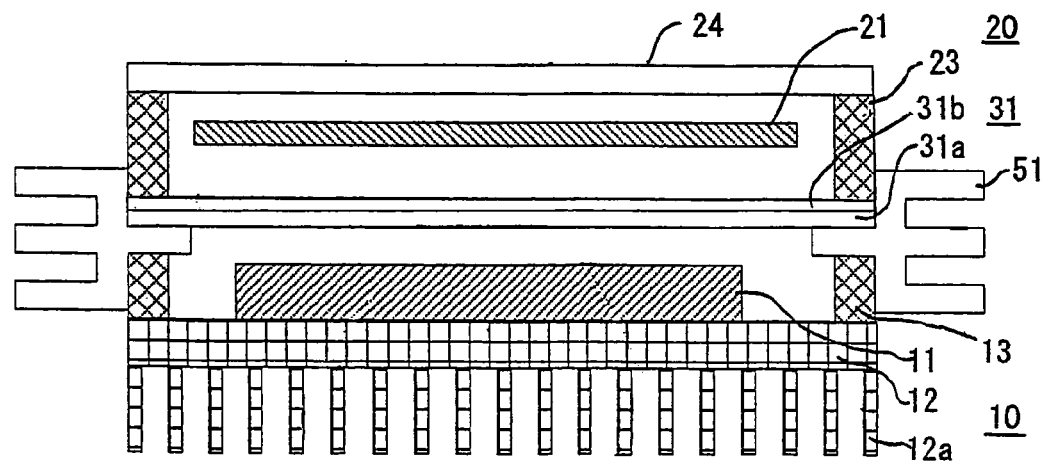
FIG. 4 is a cross sectional view of a power conversion device according to a fourth embodiment.

Construction according to a fourth embodiment is shown in FIG. 4. According to the fourth embodiment, a heat insulating partition wall 31 is located between the power conversion module section 10 and the control circuit section 20, and in which the side of the power conversion module 11 is comprised of a heat conducting plate 31a such as aluminum plate, and the side of the control circuit board 21 is comprised of a heat insulating plate 31b. Further, a radiating piece 51 equipped with a radiator fin is connected to the heat conducting plate 31a so that the radiator fin is externally disposed. The power conversion module section 10 and the control circuit section 20 are constructed in the same manner as those of FIG. 1 according to the foregoing first embodiment.

Owing to this construction, the heat conducting plate 31a is exposed to a radiant heat from the power conversion module 11, and the heat is radiated to outside from the radiating piece 51 that is connected to the heat conducting plate 31a, thus resulting in still less heat effect on the control circuit section 20.

Also in this construction, by treating a surface of the heat conducting plate 31a opposite to the power conversion module 11 to be a glossy surface of high reflectance of radiant heat, less radiant heat from the power conversion module 11 and an inner face of the heat sink 12 will be absorbed, resulting in improvement in heat insulating effect between the power conversion module section 10 and the control circuit section 20.

Embodiment 5

The foregoing first to fourth embodiments are constructed such that a power conversion module section 10 and a control circuit section 20 are contained in a module case 13 and a control circuit case 23 respectively, and a heat insulating partition wall is inserted therebetween to couple the power conversion module section 10 and the control circuit section 20. On the other hand, according to this fifth embodiment, a heat sink 12 that is coupled to the power conversion module 11 and a module case 13 in the power conversion module section 20 are formed into an integral whole being made of a material having high thermal conductivity. Thus, the number of parts comes to be advantageously smaller, a larger radiating area can be obtained, and productivity is improved.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A power conversion device comprising: a power conversion module; a control circuit board on which a control circuit to control said power conversion module is arranged; a heat sink serving to radiate generated heat of said power conversion module; and a case that contains therein said power conversion module and said control circuit board;

wherein said case is divided into a module case that contains said power conversion module and a control circuit case that contains said control circuit board;

there are provided a power conversion module section in which said power conversion module and said heat sink are thermally coupled, said power conversion module is contained in said module case in such a manner that a radiator fin of said heat sink is exposed to outside, and one side of said module case is put in an open state; and a control circuit section in which said control circuit board is contained in said control circuit case, and one side of said control circuit case is put in an open state;

and respective opening sides of said power conversion module section and said control circuit section are opposite to each other, a heat insulating partition wall functioning to do heat rejection is inserted between the opposite portions, and then said power conversion module section and said control circuit section are coupled.

2. The power conversion device according to claim 1, wherein a distance between said power conversion module and said heat insulating partition wall is not more than a predetermined distance, and an air heat insulating barrier is formed between said power conversion module and said heat insulating partition wall.

3. The power conversion device according to claim 1, wherein said heat insulating partition wall is made of a heat insulating material.

4. The power conversion device according to claim 1, wherein said heat insulating partition wall is of laminated structure comprised of a heat conducting plate that is made of a material of high thermal conductivity and a heat insulating plate that is made of a heat insulating material, and is arranged so that said heat conducting plate is on the side of said power conversion module.

5. The power conversion device according to claim 1, wherein said heat insulating partition wall is of laminate structure formed by laminating a heat conducting plate that is made of a material of high thermal conductivity and a heat insulating plate that is made of a heat insulating material, and inserting an air-gap formation member that is made by shaping a corrugated thin plate between said heat conducting plate and said heat insulating plate to form an air gap; and said heat insulating partition wall is arranged such that said heat conducting plate is on the side of said power conversion module.

6. The power conversion device according to claim 1, wherein a surface on the power conversion module side of said heat insulating partition wall is treated to be a glossy surface of high heat reflectivity.

7. The power conversion device according claim 1, wherein said heat insulating partition wall is of laminated structure comprised of a heat conducting plate that is made of a material of high thermal conductivity and a heat insulating plate that is made of a heat insulating material; said heat conducting plate is on the side of the power conversion module; and a radiating piece equipped with a radiator fin is thermally connected to the heat conducting plate on the side of said power conversion module, and is disposed so that the radiator fin of said radiating piece may be externally located.

8. The power conversion device according to claim 1, wherein a module case on the side of said power conversion module is formed integrally with said heat sink using a material of high thermal conductivity.

* * * * *